(12) United States Patent
Sjöland et al.

(10) Patent No.: US 12,218,675 B2
(45) Date of Patent: Feb. 4, 2025

(54) DIGITALLY AUGMENTED ANALOG PHASE LOCKED LOOP WITH ACCURATE BANDWIDTH

(71) Applicant: Telefonaktiebolaget LM Ericsson (publ), Stockholm (SE)

(72) Inventors: Henrik Sjöland, Lund (SE); Razvan-Cristian Marin, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 18/023,585

(22) PCT Filed: Oct. 9, 2020

(86) PCT No.: PCT/EP2020/078369
§ 371 (c)(1),
(2) Date: Feb. 27, 2023

(87) PCT Pub. No.: WO2022/073617
PCT Pub. Date: Apr. 14, 2022

(65) Prior Publication Data
US 2023/0318607 A1 Oct. 5, 2023

(51) Int. Cl.
*H03L 7/089* (2006.01)
*H03L 7/093* (2006.01)
*H03L 7/197* (2006.01)

(52) U.S. Cl.
CPC .............. *H03L 7/089* (2013.01); *H03L 7/093* (2013.01); *H03L 7/1974* (2013.01)

(58) Field of Classification Search
CPC ........ H03L 7/089; H03L 7/093; H03L 7/1974
See application file for complete search history.

(56) References Cited

U.S. PATENT DOCUMENTS 5,872,487 A 2/1999 Adachi et al.
6,028,460 A 2/2000 McCollum et al.
(Continued)

FOREIGN PATENT DOCUMENTS

CN 103338041 A 10/2013
WO 2007106414 A2 9/2007
WO 2021164881 A1 8/2021

OTHER PUBLICATIONS

Friedman, D. et al., "Hybrid PII Architectures and Implementations", CICC 2018 Tutorial, Apr. 8, 2018, pp. 1-89, IEEE.

*Primary Examiner* — Rahel Guarino
(74) *Attorney, Agent, or Firm* — COATS & BENNETT, PLLC

(57) ABSTRACT

An analog PLL employs digital circuitry for calibration and characterization, precisely setting and maintaining the bandwidth of the PLL. A digital calibration circuit calibrates the value of a resistor or capacitor in the loop filter to yield a desired RC product. A digital control circuit reads time-to-digital converters (TDC) digitizing the length of the CU and CD pulses from the phase-frequency detector (PFD) to the charge pump (CP) during a frequency change. These pulse lengths are summed to yield a measured integral CP current. The control circuit determines an integral CP current that yields a desired bandwidth, regardless of the VCO tuning sensitivity, based on the calibrated RC product. The CP current is then adjusted by the ratio of determined integral CP current to the measured integral CP current. The digital circuits do not increase power consumption or adversely affect system operation.

18 Claims, 16 Drawing Sheets

(56) References Cited

U.S. PATENT DOCUMENTS

| | | | |
|---|---|---|---|
| 8,461,886 | B1 | 6/2013 | Yao |
| 8,779,812 | B1 | 7/2014 | Kavanagh et al. |
| 9,362,924 | B1 | 6/2016 | Xu et al. |
| 2004/0207437 | A1 | 10/2004 | Shibahara et al. |
| 2005/0008113 | A1 | 1/2005 | Kokubo et al. |
| 2005/0073369 | A1* | 4/2005 | Balboni ............... H03C 3/0941 |
| | | | 331/16 |
| 2009/0096535 | A1 | 4/2009 | Chang |
| 2009/0267664 | A1 | 10/2009 | Uozumi et al. |
| 2010/0073051 | A1 | 3/2010 | Rao et al. |
| 2011/0133799 | A1* | 6/2011 | Dunworth ............... H03L 7/093 |
| | | | 327/156 |
| 2012/0249198 | A1 | 10/2012 | Sinha et al. |
| 2013/0147531 | A1 | 6/2013 | Lee et al. |
| 2019/0305781 | A1 | 10/2019 | Tsutsumi et al. |

\* cited by examiner

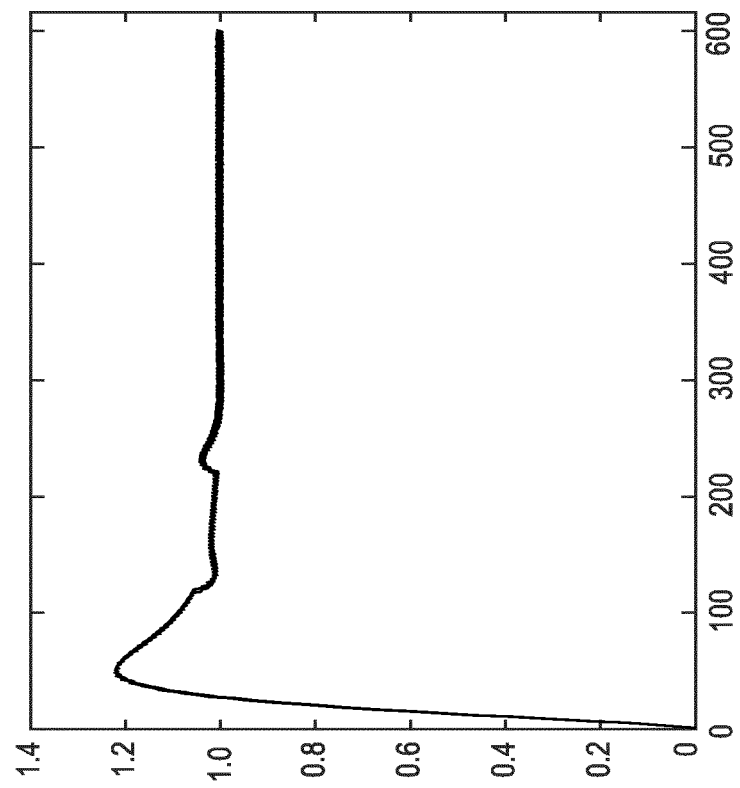
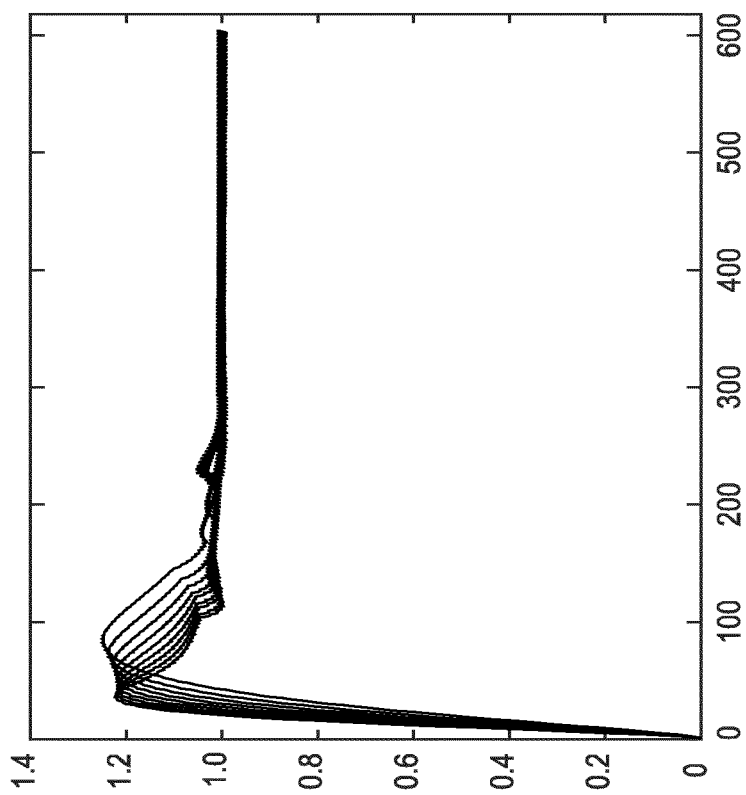

DIGITALLY AUGMENTED ANALOG PHASE LOCKED LOOP WITH ACCURATE BANDWIDTH

TECHNICAL FIELD

The present invention relates generally to Phase Locked Loop (PLL) circuits, and in particular to an analog PLL having digital augmentation for loop filter calibration and PLL bandwidth characterization.

BACKGROUND

Wireless communications are ubiquitous in modern life. Wireless communication networks connect devices, such as smartphones, machines, and vehicles, to controllers and the vast resources of the Internet. Local wireless networks, such as Wi-Fi, connect computers, televisions, appliances, and light bulbs in homes and businesses. Ad hoc wireless links, such as Bluetooth® connect headsets with telephones, music players, and more. Most of these wireless communications operate by modulating data onto Radio Frequency (RF) electromagnetic waves, and transmitting and receiving these waves through antennas.

RF transceiver circuits require reliable, accurate, agile, and inexpensive local frequency sources to accurately frequency-convert, modulate, demodulate, and beamform RF signals. For example, RF transceivers typically require a Local Oscillator (LO) signal to down-convert a received signal from the carrier frequency to baseband (and vice versa for a transmitted signal). Systems that employ frequency hopping require that the LO signal be quickly and accurately adjustable. Directional antennas use precise phase shifts between RF signals transmitted from large arrays of antenna elements to steer the transmitted RF beam, or to enhance reception in specific directions.

A well-known circuit used to generate a periodic signal from a known reference frequency, such as that provided by a crystal oscillator or other precise source, is a Phase Locked Loop (PLL). A PLL operates according to a negative feedback control loop, in which the phase of a generated signal is locked to that of a reference signal. A basic modern analog PLL comprises a reference source, a phase frequency detector (PFD), a charge pump (CP), a loop filter (LF), and a voltage controlled oscillator (VCO). To generate a higher frequency output than the reference signal, a divider circuit is included internally, dividing the output of the VCO. The phase of the divided VCO output is compared with the phase of the reference signal at the PFD (for simplicity, the VCO output is considered herein to be divided by one if no divider circuit is included). The polarity of the measured phase difference controls whether a Charge Up (CU) or Charge Down (CD) signal is input to the CP from the PFD. The CP responsively generates and injects positive or negative current into an integrating capacitor in the LF, transferring charge to or from the capacitor. The pulse width of the CU or CD input, which determines the amount of charge transferred to/from the capacitor, is proportional to the magnitude of the detected phase difference. The LF converts this charge to a tuning voltage, which controls the output frequency of the VCO. The negative-feedback loop operates to eliminate detected phase errors. In steady-state operation, the VCO output is phase-locked to the reference signal, and its frequency is an integer or fractional multiple of the reference signal frequency, as determined by the division number input to the divider.

A PLL may operate in the analog or digital domain. Advantages of a digital PLL include the absence of large area capacitors in the analog loop filter, and the possibility to support advanced digital algorithms, such as increasing loop bandwidth during operation to implement fast frequency hops. However, digital PLLs are highly complex, requiring a major design effort.

On the other hand, advantages of an analog PLL include reduced design complexity, and excellent phase noise. As one example of the design trade-offs, the simplicity of an analog PLL makes it an excellent choice at very high frequencies or for very low power. However, the design of an analog PLL is inflexible. For example, the loop filter cannot be re-configured without introducing transients, the bandwidth is limited by the reference frequency used, and the phase detector has a limited range. These characteristics make it difficult to increase the speed of frequency acquisition of an analog PLL. The capacitors in the loop filter must be (dis)charged, and the charge pump can only provide a certain charging current. This charging current is set by the PLL bandwidth, which is connected to the filter response, so it typically cannot be increased. Techniques can be used to increase the CP current, such as either reconfiguring the loop filter for higher bandwidth, or reducing the reference frequency and keeping the bandwidth. Regardless, the charging of the loop filter will not be performed with 100% of the available CP current. The linear operation of the PLL will require the charging current to vary during the frequency step. Should the current actually reach 100%, the phase frequency detector (PFD) may tip over, yielding a CU or CD output signal close to zero. This is called a cycle slip and it will slow down the frequency transition by effectively preventing the CU or CD signal from controlling the CP to reach an effective charging current close to 100%. A high CP charging current is desirable, as it minimizes the frequency transition time of the PLL.

PLLs can be used also to generate phase and frequency modulated signals for transmitters. For instance, Bluetooth uses such modulation, and a simple and efficient transmitter can be realized by feeding the modulated PLL output signal directly to a power amplifier, without any need for frequency up-conversion mixers.

However, the transfer function of an analog PLL is dependent on a number of parameters with wide variation, such as loop filter resistance and capacitance, and VCO frequency tuning sensitivity. The transfer function will therefore also show a wide variation, decreasing the accuracy of signal modulation. Particularly the higher frequency components of the phase/frequency modulation, with modulation frequencies near the PLL bandwidth, will have a large variability in both magnitude and phase. This will cause problems in de-modulation, degrading the performance of the system.

Digital PLLs, on the other hand, have more flexibility. The loop bandwidth can be adapted during operation to speed up frequency acquisition, and digital information is available for transfer function calibration. However, digital PLLs are highly complex, requiring a major design effort, and the complexity may be unfeasible for designs requiring operation at very high frequency (mm-wave) or with ultra-low power consumption.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to embodiments of the present invention described and claimed herein, an analog PLL employs digital circuitry for calibration and characterization, precisely setting and maintaining the bandwidth of the PLL. A digital calibration circuit calibrates the value of the resistors and/or capacitors in the loop filter to yield a desired RC product. A digital control circuit reads time-to-digital converters (TDC) digitizing the length of the CU and CD pulses from the phase-frequency detector (PFD) to the charge pump (CP) during a frequency change. These pulse lengths are summed to yield a measured integral. The control circuit determines an integral that would result when the PLL has a desired bandwidth, regardless of the VCO tuning sensitivity, based on the calibrated RC product. The CP current is then adjusted by the ratio of determined integral to the measured integral. The digital circuits are only active initially, and occasionally to compensate for temperature drift or upon a significant frequency change. Since they are not used during normal PLL operation, the digital circuits do not increase power consumption or adversely affect system operation. The digital circuits are also useful to assist the PLL to make fast frequency changes, as disclosed in PCT Patent Application No. PCT/EP2020/054601 by the present applicant.

One embodiment relates to a method of controlling the bandwidth of a digitally augmented analog Phase Locked Loop (PLL) comprising a Phase Frequency Detector (PFD), a Charge Pump (CP), a loop filter (LF), a Voltage Controlled Oscillator (VCO), and a frequency divider (DIV). A Digital Control circuit calibrates the LF to have a predetermined RC product. The digital circuit further bandwidth characterizes the PLL, based on the predetermined RC product, to yield a desired bandwidth.

In one embodiment, calibrating the LF comprises applying a reference frequency clock signal to a variable calibration switched capacitor; comparing an effective resistance of the variable calibration switched capacitor to a predetermined calibration resistance and generating a digital command word based on the difference; adjusting the capacitance of the variable calibration switched capacitor by applying the digital command word, until the variable calibration switched capacitor's effective resistance matches the predetermined resistance, within a tolerance; storing the digital command word; and applying the digital command word to a loop filter variable capacitance. The predetermined calibration resistance is chosen such that after calibration, the loop filter RC product has a predetermined value.

In one embodiment, bandwidth characterizing the PLL comprises changing an output frequency of the PLL by changing a division value of the DIV; measuring an integrated PFD output signal due to the frequency change by summing outputs of a Time to Digital Converter (TDC) connected to charge-up and/or charge-down signals output by the PFD to the CP; determining (306) a target integrated PFD output signal based on the predetermined RC product and desired bandwidth; calculating a ratio of determined target integrated PFD output signal to measured integrated PFD output signal; and adjusting the CP current by the calculated ratio.

In one embodiment determining a target integrated PFD output signal based on the predetermined RC product and desired bandwidth comprises determining the target integrated PFD output signal as proportional to the RC product divided by the desired bandwidth. The target integrated PFD output signal is also proportional to the PLL output frequency change.

Another embodiment relates to a digitally augmented analog Phase Locked Loop (PLL). The PLL includes an analog PLL comprising a Phase Frequency Detector (PFD) configured to compare a PLL feedback signal to a reference frequency input and output charge-up or charge-down pulses having a length proportional to a phase error between the feedback and reference signals; a Charge Pump (CP) configured to generate a positive or negative CP current in response to the length of the charge-up or charge-down pulses, respectively; a loop filter (LF) configured to accumulate or dissipate charge on a capacitor in response to the CP current and to output a responsive control voltage; a Voltage Controlled Oscillator (VCO) configured to generate a periodic output signal having a frequency determined by the control voltage; and a frequency divider (DIV) configured to divide the periodic output signal by an integer or fractional amount to generate the PLL feedback signal. The analog PLL is augmented with a Time to Digital Converter (TDC) receiving the charge-up and/or charge-down pulses and configured to output a digital value indicating the duration of the pulses; a digital LF calibration circuit configured to control a value of one or both of a resistor and a capacitor in the LF so as to achieve a predetermined RC product; and a Digital Control circuit. The Digital Control circuit is configured to calibrate the LF to have a predetermined RC product; and bandwidth characterize the PLL, based on the predetermined RC product, to yield a desired bandwidth.

In one embodiment, the Digital Control circuit is configured to calibrate the LF by: applying a reference frequency clock signal to a variable calibration switched capacitor; comparing an effective resistance of the variable calibration switched capacitor to a predetermined calibration resistance and generating a digital command word based on the difference; adjusting the capacitance of the variable calibration switched capacitor by applying the digital command word, until the variable calibration switched capacitor's effective resistance matches the predetermined resistance, within a tolerance; storing the digital command word; and applying the digital command word to a loop filter variable capacitance. The predetermined calibration resistance is chosen such that after calibration, the loop filter RC product has a predetermined value.

In one embodiment, the Digital Control circuit is configured to bandwidth characterize the PLL by changing an output frequency of the PLL by changing a division value of the DIV; measuring an integrated PFD output signal resulting from the frequency change by summing outputs of the TDC; determining a target integrated PFD output signal based on the predetermined RC product and desired bandwidth; calculating a ratio of determined target integrated PFD output signal to measured integrated PFD output signal; and adjusting the CP current by the calculated ratio.

In one embodiment, the Digital Control circuit is configured to determine a target integrated PFD output signal based on the predetermined RC product and desired bandwidth by determining the target integrated PFD output signal as proportional to the RC product divided by the desired bandwidth.

Yet another embodiment relates to a wireless device operative in a wireless communication network. The wireless device includes processing circuitry and communication circuitry operatively connected to the processing circuitry. The communication circuitry includes one or more digitally augmented Phase Locked Loops as described herein.

Still another embodiment relates to a network node operative in a wireless communication network. The network node includes processing circuitry and communication circuitry operatively connected to the processing circuitry. The communication circuitry includes one or more digitally augmented Phase Locked Loops as described herein.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 15A is a plot of simulated PLL step response over a $K_{VCO}$ variation of +/−40%, without BW characterization.

FIG. 15B is a plot of simulated PLL step response over a $K_{VCO}$ variation of +/−40%, with BW characterization.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
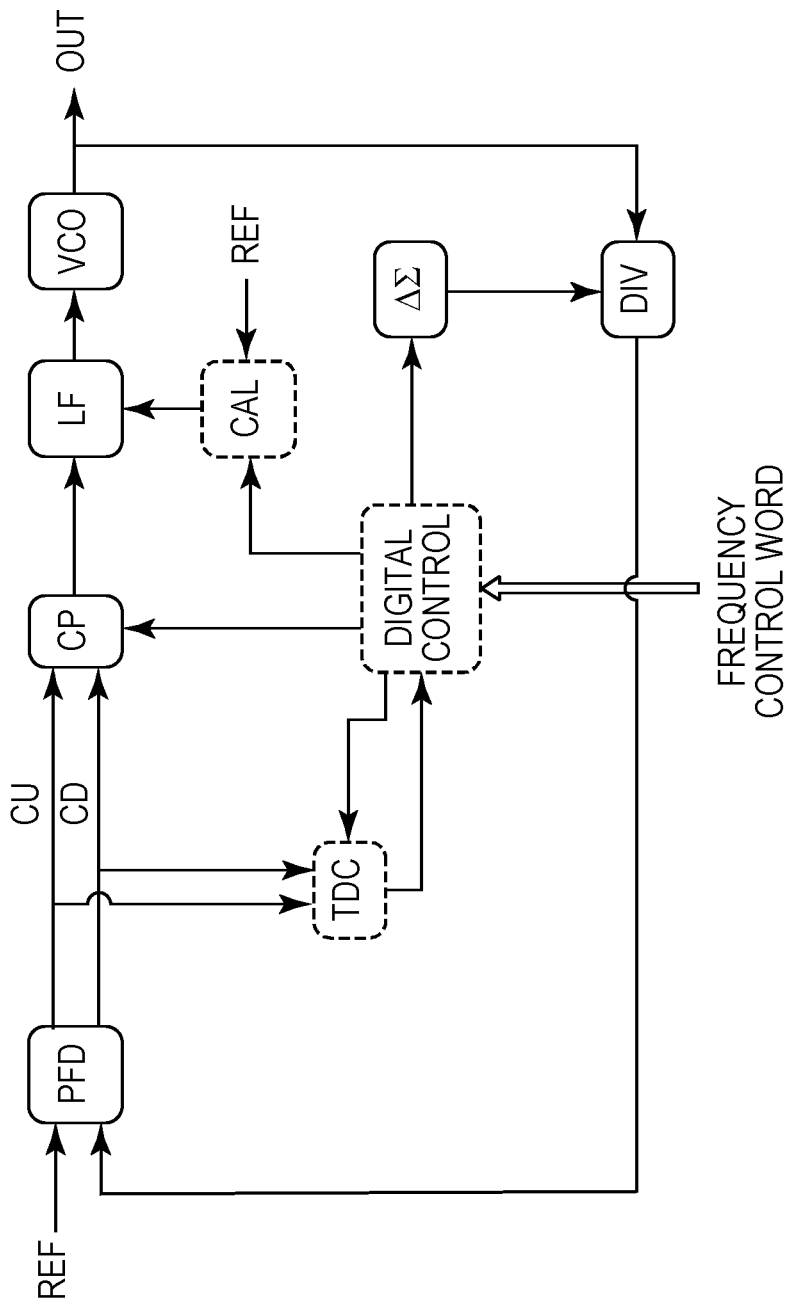
FIG. 1 is a block diagram of a digitally augmented analog PLL circuit.

FIG. 1 depicts a hybrid PLL, comprising both analog components, shown in solid line, and digital components, indicated by dashed lines. The analog PLL operates conventionally. The digital circuits are activated for calibration and characterization.

In normal operation, a voltage controlled oscillator (VCO) generates a high-frequency periodic output signal. A frequency divider (DIV) divides the output signal by an integer value. A delta-sigma modulator (ΔΣ) enables division by fractional values by controlling the instantaneous integer value of the DIV. The divided VCO output signal is compared to an accurate reference signal in the phase frequency detector (PFD). The PFD generates charge-up (CU) or charge-down (CD) current demand pulses, depending on the direction of phase error. The length of these pulses indicates the charge required from the charge pump (CP). The CP generates a corresponding current, and injects it into (or sinks it from) a capacitor in the loop filter (LF). The LF converts the charge on the capacitor into a control voltage, which controls the frequency of the VCO output signal.

A time to digital converter (TDC) measures the duration of CU and/or CD current demand pulses. The digital control circuit reads the TDC, and accumulates the sum $TDC_{SUM}$ of the pulses during a commanded frequency step. The sum $TDC_{SUM}$ is proportional to an integral of current, and corresponds to the charge injected into the loop filter by the charge pump. More specifically, the charge injected into the loop filter is proportional to $TDC_{SUM}$ multiplied by the charge pump current $I_{CP}$. To achieve the step in control voltage corresponding to the commanded frequency step, this charge is also proportional to the loop filter capacitance, and inversely proportional to the VCO frequency tuning sensitivity $K_{VCO}$. $TDC_{SUM}$ can thus be written as $$TDC_{SUM} \sim \frac{c}{K_{VCO} \cdot I_{CP}} \quad (1)$$

A digital calibration circuit (CAL) calibrates the RC time constant of the PLL loop filter to a predetermined value, based on an accurate reference frequency (REF). With a calibrated loop filter RC constant, the loop filter pole and zero are close to their nominal values. This facilitates estimation of the charge pump current adjustment ratio for achieving the nominal transfer function. The cumulative sum TDC$_{SUM}$ should be made as close as possible to its nominal value, which means that $$K_{VCO} \cdot I_{CP} \sim C \qquad (2)$$

For example, if TDC$_{SUM}$ is 20% lower than the nominal value, the charge pump current I$_{CP}$ should be reduced by 20%, and vice versa.

In nominal conditions the bandwidth of the PLL is proportional to the VCO tuning sensitivity, the charge pump current, and the loop filter resistance $$BW \sim K_{VCO} \cdot I_{CP} \cdot R \qquad (3)$$

Combining equations (2) and (3), the bandwidth of the PLL then becomes proportional to the RC product of the loop filter, which was previously calibrated by the digital circuit CAL. The transfer function of the PLL will thus be close to nominal, with both bandwidth and loop filter pole and zero calibrated. By comparing the measured integrated TDC$_{SUM}$ to the nominal value, the actual charge pump current I$_{CP}$ is adjusted, achieving the desired BW independently of variations in the VCO tuning sensitivity K$_{VCO}$. This process is referred to herein as characterizing the PLL.

By characterizing the PLL in this manner, high phase/frequency modulation accuracy is obtained. The PLL output signal can be modulated using the delta-sigma modulator A controlling the variable modulus frequency divider DIV in the feedback path. Due to the accurately known transfer function, accurate digital pre-emphasis can also be applied, even if a desired modulation bandwidth exceeds that of the PLL.

Embodiments of the present invention thus enjoy benefits of both analog and digital PLLs. The digital circuitry (Control, TDC, CAL) is only activated during frequency acquisition and calibration/characterization, and will thus be insignificant to average power consumption. The loop filter RC calibration is performed at start-up, and then occasional re-calibrations may be needed due to temperature drift. Characterization to set the BW may be needed after frequency changes, and if the temperature drifts.

Loop Filter Calibration

As discussed above, the Digital Control circuit activates the loop filter calibration circuit CAL at PLL power-on, or when the temperature has changed significantly. The calibration process adjusts the value of the loop filter resistor and/or capacitors, to set the RC product of the loop filter to a predetermined value. This ensures that the loop filter pole and zero occur close to their targeted frequencies. After calibration, a digital value is stored in flip-flops connected to the loop filter, which maintains the calibrated resistor or capacitor value, and thus the predetermined RC product. The Digital Control block then deactivates the CAL circuit.

Figure 2:
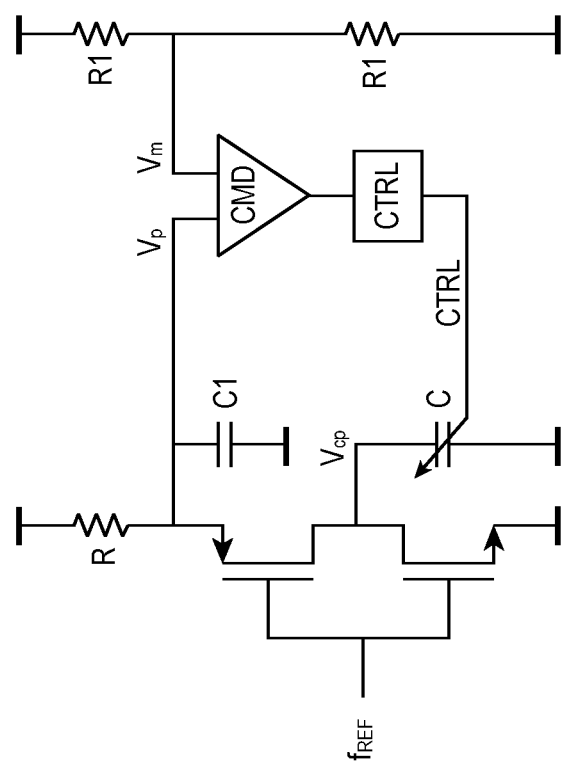
FIG. 2 is a schematic diagram of one embodiment of a loop filter calibration circuit.

A suitable CAL circuit is shown in FIG. 2. An inverter, created by stacked NMOS and PMOS transistors, inverts an accurate frequency clock signal and applies it to a variable capacitor. The effective resistance of the clocked (switched) capacitor is then compared to a known resistance R1, by comparing voltages Vp and Vm at the inputs to a comparator. In response to this comparison, a digital control word (ctrl) adjusts the value of the variable capacitor, such as a switched capacitor bank, until its effective resistance at the reference frequency matches that of R1. The digital control word (ctrl) is then stored in flip-flops, and applied to an identical capacitor bank in the loop filter, yielding a known capacitance and hence RC product. Those of skill in the art will readily recognize that a variable resistor could instead be adjusted in the same manner, and a corresponding variable resistor in the loop filter set to the calibrated value. In either case, the calibration circuit CAL is deactivated after the calibration process, so it does not dissipate power or impact performance of the PLL. Only the flip-flops holding the digital control word (ctrl) remain powered, but they do not switch, and hence are insignificant to power consumption.

Figure 3:
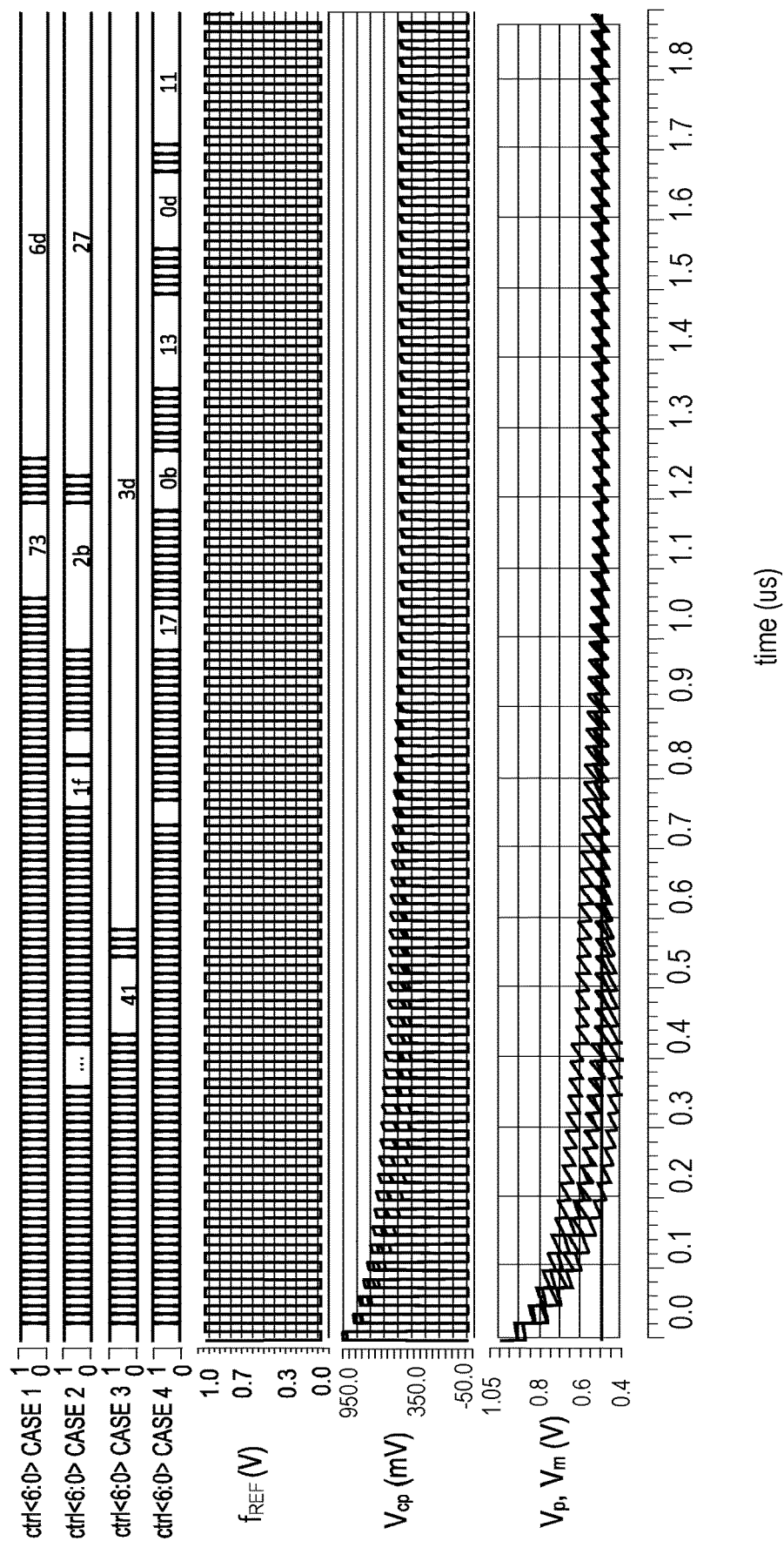
FIG. 3 is a timing diagram showing a loop filter calibration process.
Figure 4:
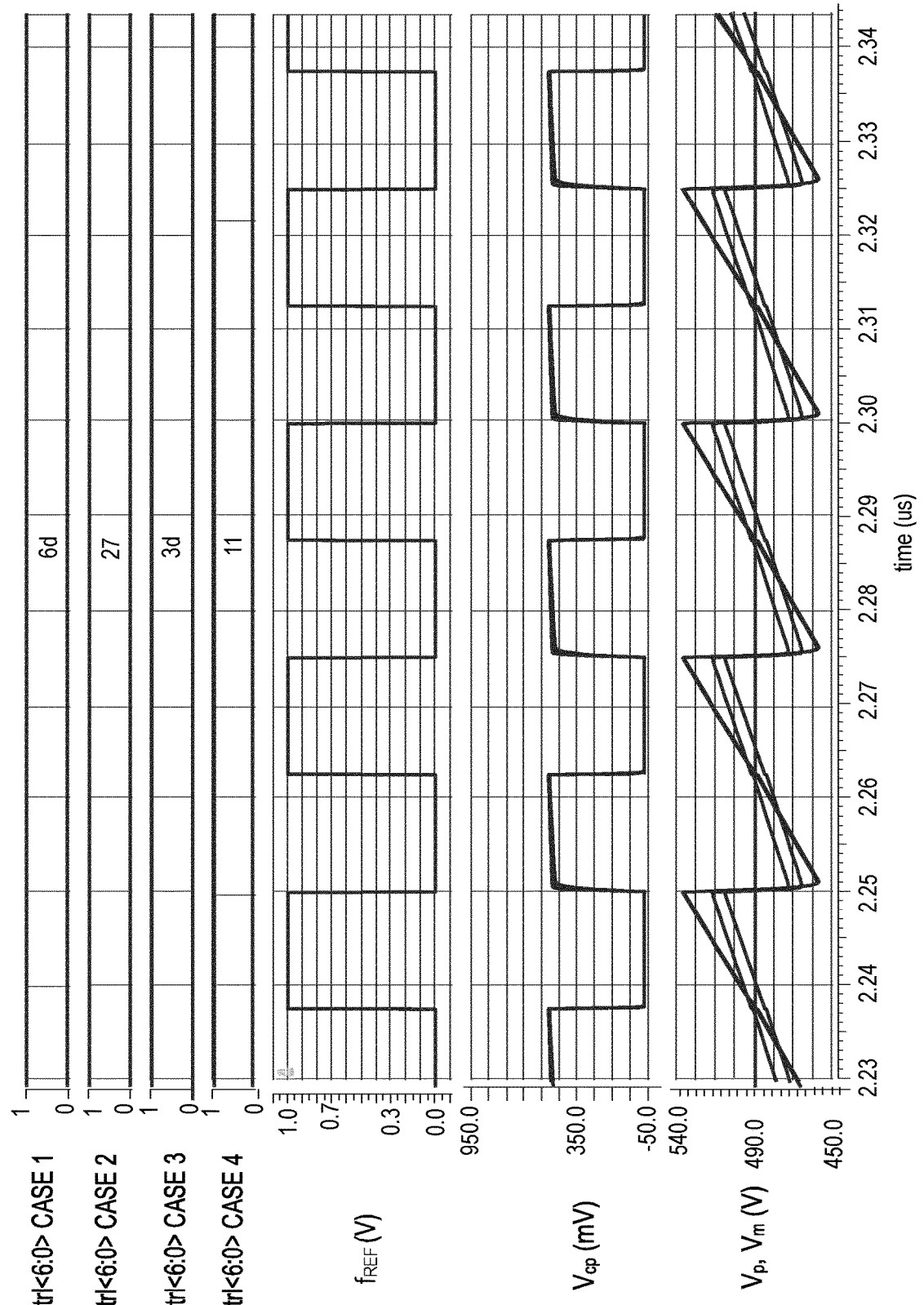
FIG. 4 is a timing diagram showing greater detail of the loop filter calibrated signals, after the circuit has settled, as depicted in FIG. 3.

The circuit in FIG. 2 was simulated for R=9 kΩ, and initial C=1 pF. A 7-bit binary capacitor bank was used to adjust the total capacitance at the inverter output node, with the maximum added capacitance of around 4.5 pF in the nominal case (no capacitance variation). Therefore, the digital control word (ctrl) controlling the capacitor bank has the same length, namely 7-bit (ctrl<6:0> in FIGS. 3 and 4). A ±30% variation was assumed for the resistance, and ±20% variation for the capacitance. Simulation results are shown in FIGS. 3 and 4, for the four cases presenting the largest variation, namely (Cvar, Rvar)=[(−20%, −30%); (−20%, +30%); (+20%, −30%); (+20%, +30%)], which are denoted for simplicity Case1, Case2, Case3, and Case4, respectively. In addition, R1=1 kΩ, C1=25 pF, and f$_{ref}$=40 MHz. The supply voltage VDD is set to 1 V, resulting in Vm≈500 mV, and the window comparator thresholds were set at ±5 mV with respect to Vm when a rising clock edge is seen at the input of the inverter. The results in FIG. 3 show that when convergence is achieved, the digital control word ctrl settles to a fixed value, the maximum amplitude of the inverter output signal vcp is stable, the positive input of the comparator Vp settles within the ±5 mV thresholds at the rising clock edge of f$_{ref}$, and the negative input of the comparator Vm remains fixed at ~500 mV. In addition, FIG. 4 shows greater detail of the loop filter calibrated signals, after the circuit has settled (i.e., at the right side of FIG. 3).

Figure 5B:
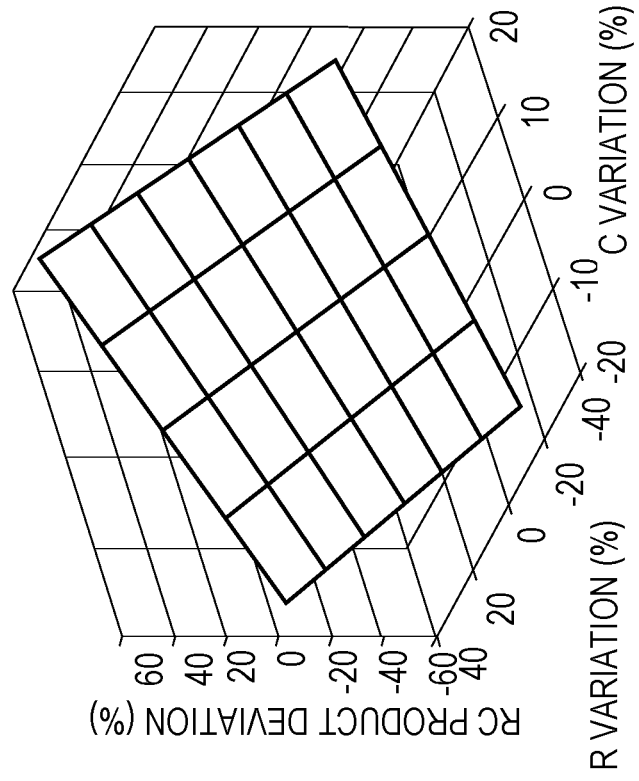
FIG. 5B is a graph of RC product deviation for varying values of R and C without loop filter calibration.
Figure 5A:
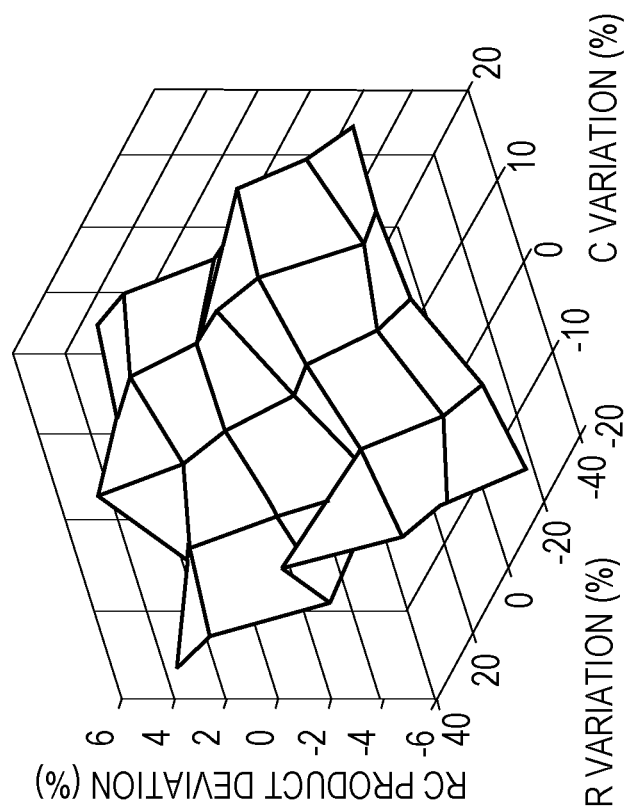
FIG. 5A is a graph of RC product deviation for varying values of R and C after loop filter calibration.

When assuming ±30% variation for the resistance, and ±20% variation for the capacitance, the resulting calibrated RC product variation is ~±5% using the inventive calibration process, as shown in FIG. 5A. In contrast, FIG. 5B depicts the RC product variation of ~±50% without calibration. Comparison of FIGS. 5A and 5B show that the inventive calibration reduces the RC product variation by a factor of approximately ten. Those of skill in the art will recognize that the RC product variation can be further improved (i.e., lower than ±5%) with additional circuit optimization.

PLL Bandwidth Characterization

After the loop filter RC product has been calibrated, the Digital Control circuit configures the PLL for BW characterization. The BW characterization may also be repeated when the commanded PLL output center frequency or the temperature has changed significantly since last BW characterization. The TDC is activated to monitor the CU/CD current demand pulses output by the PFD. The BW characterization process proceeds by performing a PLL output frequency step, by changing the Frequency Control Word, and monitoring the TDC outputs. The frequency step could be taken in coordination with a frequency change that caused the need for BW characterization. For example, the frequency could be changed to a frequency at a suitable distance from the final target. Then a frequency step is taken to the final frequency while measuring the TDC outputs. The step size should not be too small, so as not to lose accuracy due to TDC quantization. However, it should not be too large, as the BW characterization result will then be less valid at the final frequency, due to the frequency dependency of VCO tuning sensitivity. Those of skill in the art may readily ascertain an appropriate frequency step for a given PLL configuration, given the teachings of the present disclosure. In any event, high accuracy is achieved over a wide range of frequency step sizes. If a temperature change necessitates a BW characterization, a suitable time for the characterization must first be found when the PLL output is not actively used. Two frequency steps are then taken, first one for the measurement, and then one back to the original output frequency, or vice versa.

First, a frequency step is taken by commanding a new digital frequency control word to the PLL. The resulting CU or CD current demand pulses are measured by the TDC, and the result is integrated by cumulative summation. This integral over the step response is proportional to the total loop filter capacitance, divided by the gain of the VCO ($K_{VCO}$) and the charge pump current ($I_{CP}$), as shown in equation (1).

Figure 6:
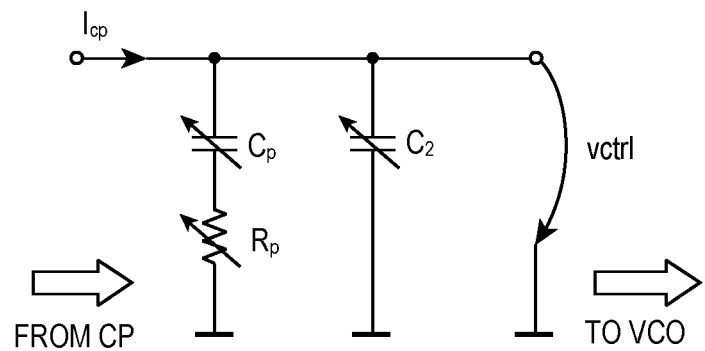
FIG. 6 is a schematic diagram of a loop filter with configurable R and C components.
Figure 7:
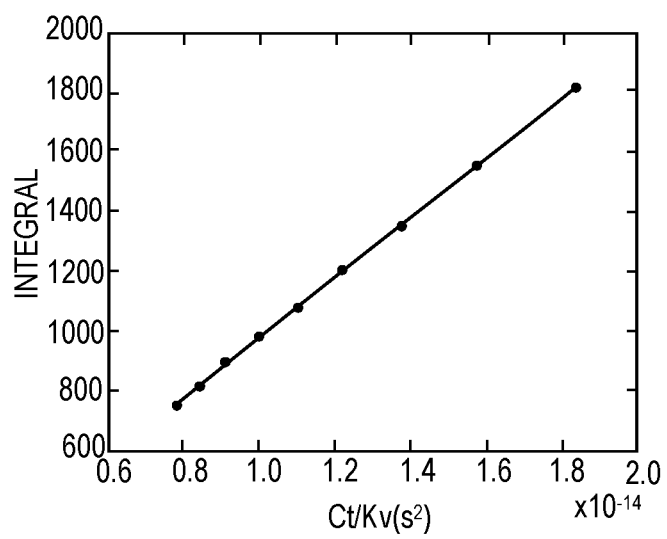
FIG. 7 is a graph of integrated PFD output signal vs. $C_i/K_v$ over a $K_{VCO}$ variation of +/−40%

The PLL of FIG. 1 was simulated in a Cadence environment with the following initial parameters: for the LF filter depicted in FIG. 6, $R_p$=32 kΩ, $C_p$=50 pF, $C_2$=5 pF, and $I_{CP}$=25 µA. The gain of the VCO ($K_{VCO}$) was varied between 120 MHz/V and 280 MHz/V, with a step size of 20 MHz/V. For each case, the cumulative sum $TDC_{SUM}$ was calculated based on the simulated outputs of the TDC, which measure the quantized length of CU or CD current demand pulses. A 6-bit TDC resolution was used for all simulations. The results are plotted in FIG. 7 and underline the nearly linear dependency of the integral (cumulative sum) with respect to $C_t/K_v$, where $C_t$ is the total filter capacitance, and $K_v = K_{VCO}*I_{CP}$.

Second, an estimate is made of a ratio by which the charge pump current must be changed to achieve the targeted bandwidth. As equation (3) states, the bandwidth of the PLL is proportional to the VCO gain, charge pump current, and loop filter resistor, when the bandwidth is correct so that the loop filter is resistive at the cut-off frequency. The PLL bandwidth (BW) is obtained as the −3 dB bandwidth in a Bode magnitude plot of the PLL closed-loop function $$G_{cl} = \frac{I_{CP} \cdot K_{VCO}}{N \cdot C_2} \cdot \frac{s + \frac{1}{\tau_1}}{s^3 + \frac{1}{\tau_2} \cdot s^2 + \frac{I_{CP} \cdot K_{VCO}}{N \cdot C_2} \cdot \left(s + \frac{1}{\tau_1}\right)} \quad (4)$$

where $\tau_1 = R_p * C_p$, $\tau_2 = \tau_1 *(C_p/C_2+1)$, and N is the integer frequency division number.

Figure 8:
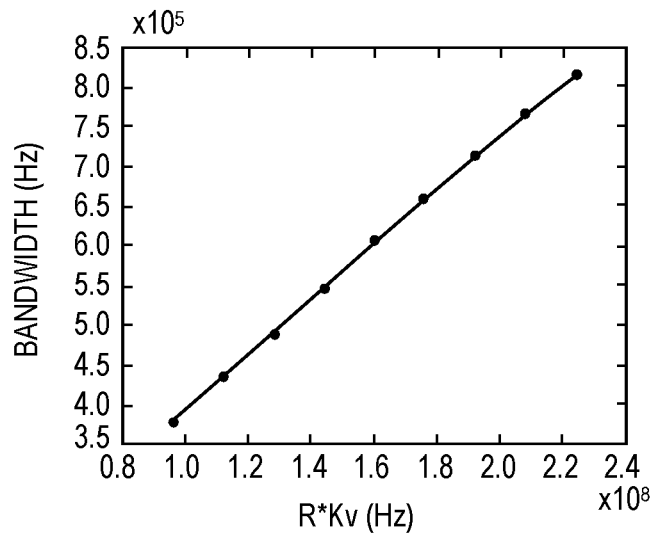
FIG. 8 is a graph of PLL bandwidth vs. $R*K_v$

FIG. 8 plots the PLL bandwidth against the $R*K_v$ product ($K_v = K_{VCO}*I_{CP}$) for a ±40% $K_{VCO}$ variation.

Figure 9:
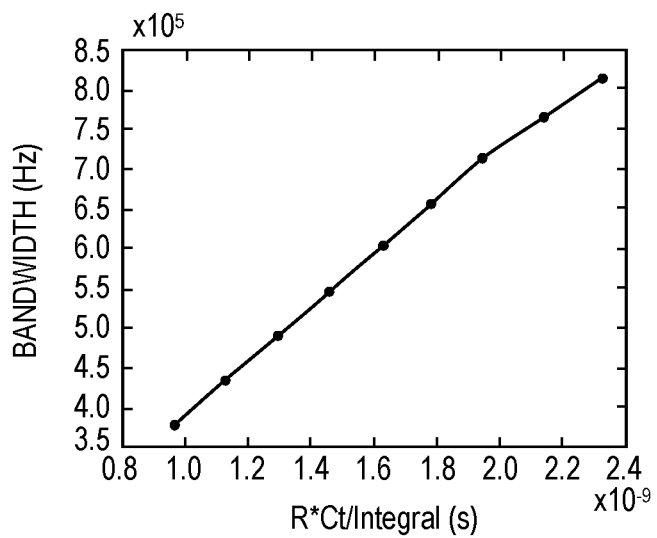
FIG. 9 is a graph of PLL bandwidth vs. $R*C_i$/Integral.

The PLL bandwidth is proportional to the loop filter RC product divided by the measured integral $TDC_{SUM}$. This relationship is plotted in FIG. 9. Up to a certain bandwidth, in this case about 700 kHz, there is a linear dependency between the bandwidth and $R*C_t$/Integral, which is independent of the $K_{VCO}$ variation. However, the results deviate for larger bandwidths, when the PLL bandwidth is outside the range for which the loop filter is designed. In this case, the loop filter is no longer mainly resistive at the cut-off frequency. However, this will not affect the end result of the BW characterization, since as long as the PLL is stable during the BW characterization, the loop filter will be resistive at the cut-off frequency after the characterization, and the result will be unaffected.

Figure 10:
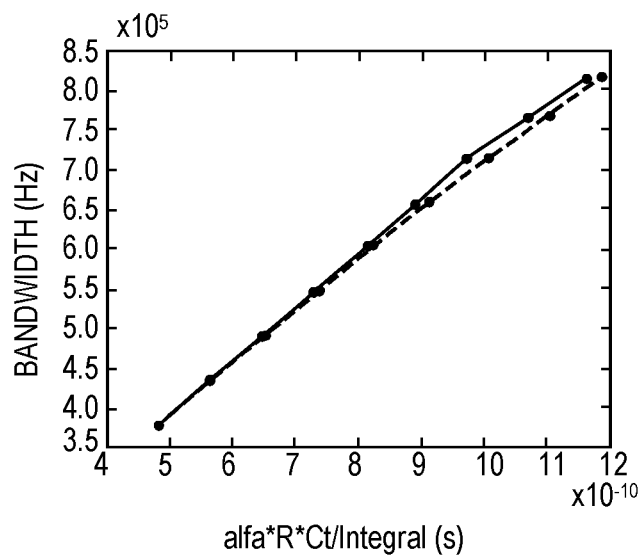
FIG. 10 is the graph of FIG. 9 with a normalization factor.

FIG. 10 shows that for large fractional frequency steps, the PLL bandwidth as function of the $R*C_t$/Integral product is almost the same (less than 1.5% variation at 600 kHz PLL bandwidth), up to a certain PLL bandwidth (where the loop filter is no longer mainly resistive at the cut-off frequency). FIG. 10 shows the PLL bandwidth with respect to $R*C_t$/Integral product for two different frequency step sizes, step1=32 and step2=43. The unit frequency step is equivalent to fu=$N*f_{ref}/2^{Nfw}$, where $N_{fw}$ is the resolution (number of bits) used in the frequency control word to set the fractional division number. For all simulation, a 6-bit resolution was used to set the fractional division number. In this case, a maximum fractional step value of 64 corresponds to an integer step of size one. The $R*C_t$/Integral product is multiplied by a factor alfa which is introduced in order to normalize the step value, namely alfa=step/stepmax (stepmax is set to 64 in this case and corresponds to the fractional frequency resolution). Note that for the same TDC resolution, the smaller the frequency steps, the larger the errors due to the TDC quantization, but with larger step size the BW characterization becomes more uncertain in frequency.

Since the loop filter RC product has already been tuned to the correct value, the value of the integral (cumulative sum) corresponding to the desired bandwidth is used to calculate a ratio between the desired value of the integral and the measured integral $TDC_{SUM}$. By adjusting the charge pump current $I_{CP}$ according to this ratio, the correct bandwidth is maintained independently of $K_{VCO}$ variations.

Figure 11:
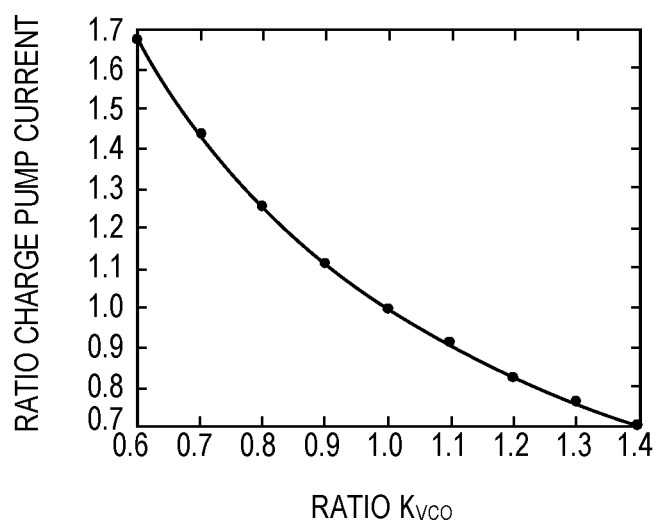
FIG. 11 is a graph of estimated ratios of CP current vs. ratios of $K_{VCO}$.

FIG. 11 plots the ratio of charge pump current to the ratio of $K_{VCO}$ variations. In this simulation, a nominal bandwidth of 620 kHz and an RC product of 1.76 µs were used. $K_{VCO}$ variations of +−40% were simulated. Using the step response simulations, the corresponding cumulative sum values were obtained (1080 in the nominal case), which depend also on the TDC resolution. Next, the ratio between the desired value of the integral and the measured cumulative sum $TDC_{SUM}$ is derived. This ratio is then used to adjust the charge pump current, as shown in FIG. 11. This graph shows the expected inverse proportionality between $K_{VCO}$ and charge pump current $I_{CP}$.

Finally, the charge pump current $I_{CP}$ is adjusted by the calculated ratio. In one embodiment, this is achieved via a programmable charge pump current, for example using switched current sources. High resolution is not necessary, and binary weighting can be used for simplicity. After setting the charge pump current, the bandwidth of the PLL is close to the targeted bandwidth.

Figure 12:
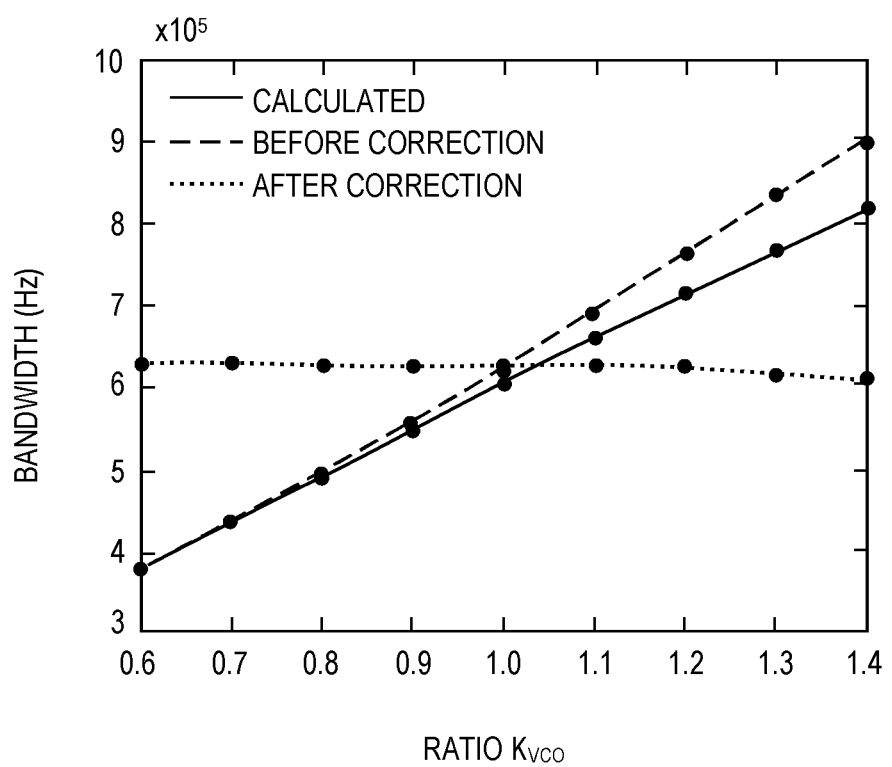
FIG. 12 is a graph of PLL bandwidth vs. ratios of $K_{VCO}$ for estimated and simulated PLLs without BW characterization, and simulated PLL with BW characterization.

FIG. 12 shows the results of the BW characterization. The solid line plots the PLL bandwidth calculated based on the transfer function. The dashed line plots the PLL bandwidth before BW characterization based on the PLL simulation in Cadence, using the System Identification Toolbox in MATLAB. The dotted line plots the PLL bandwidth after BW characterization, as simulated in Cadence with the adjusted charge pump current values. The simulated bandwidth deviation after BW characterization is less than 2% with respect to the desired PLL bandwidth, when the $K_{VCO}$ variation is ±40%.

Figure 13:
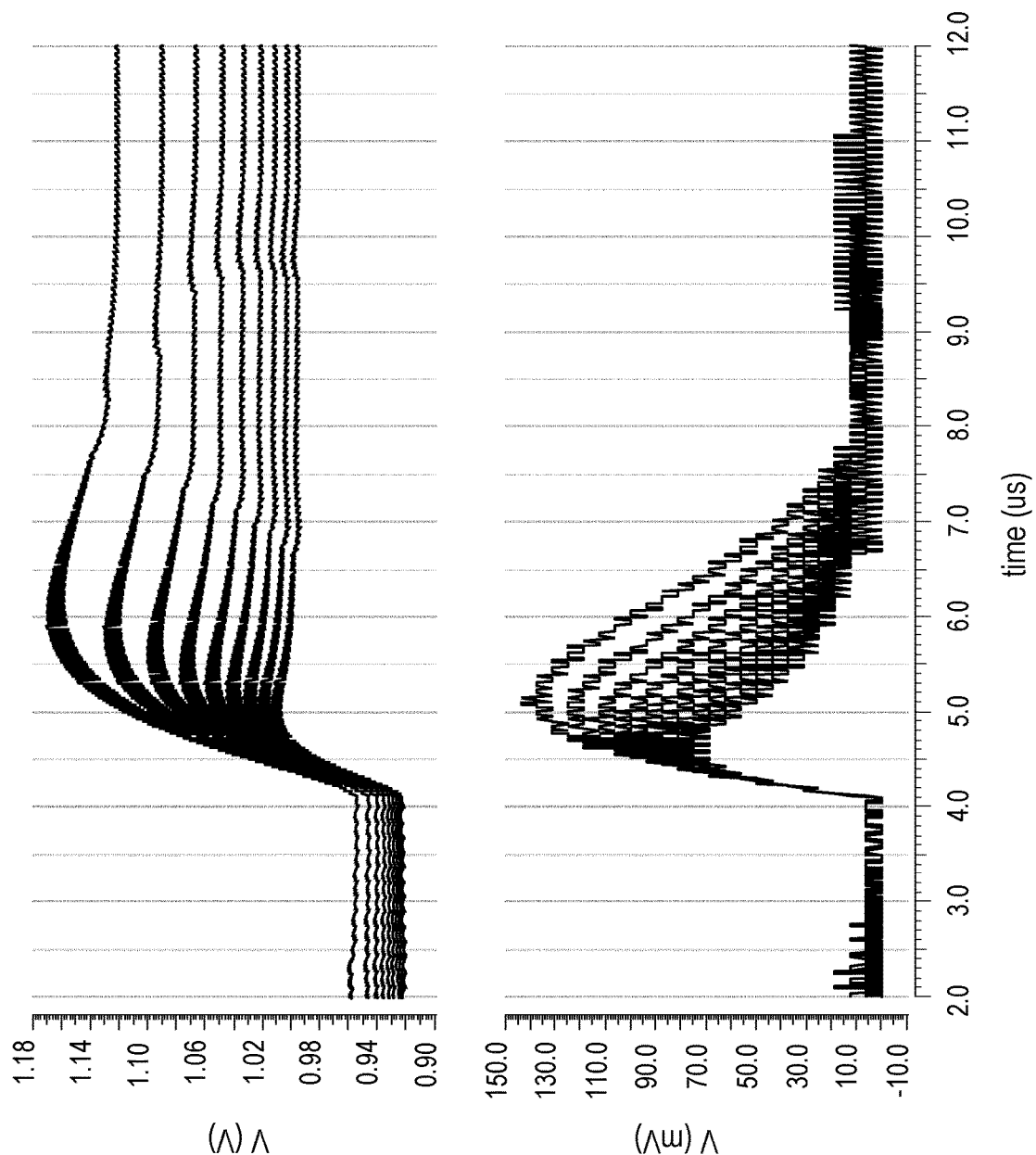
FIG. 13 is a plot of simulation results of VCO control voltage and TDC output over a $K_{VCO}$ variation of +/−40%, without BW characterization.

FIG. 13 plots the simulated VCO control voltage ($v_{ctrl}$) and the output of the TDC (updn_v), without correction, for a $K_{VCO}$ variation of ±40%, which reveals different step responses as expected. The different time durations of the step responses correspond to different PLL bandwidths.

Figure 14:
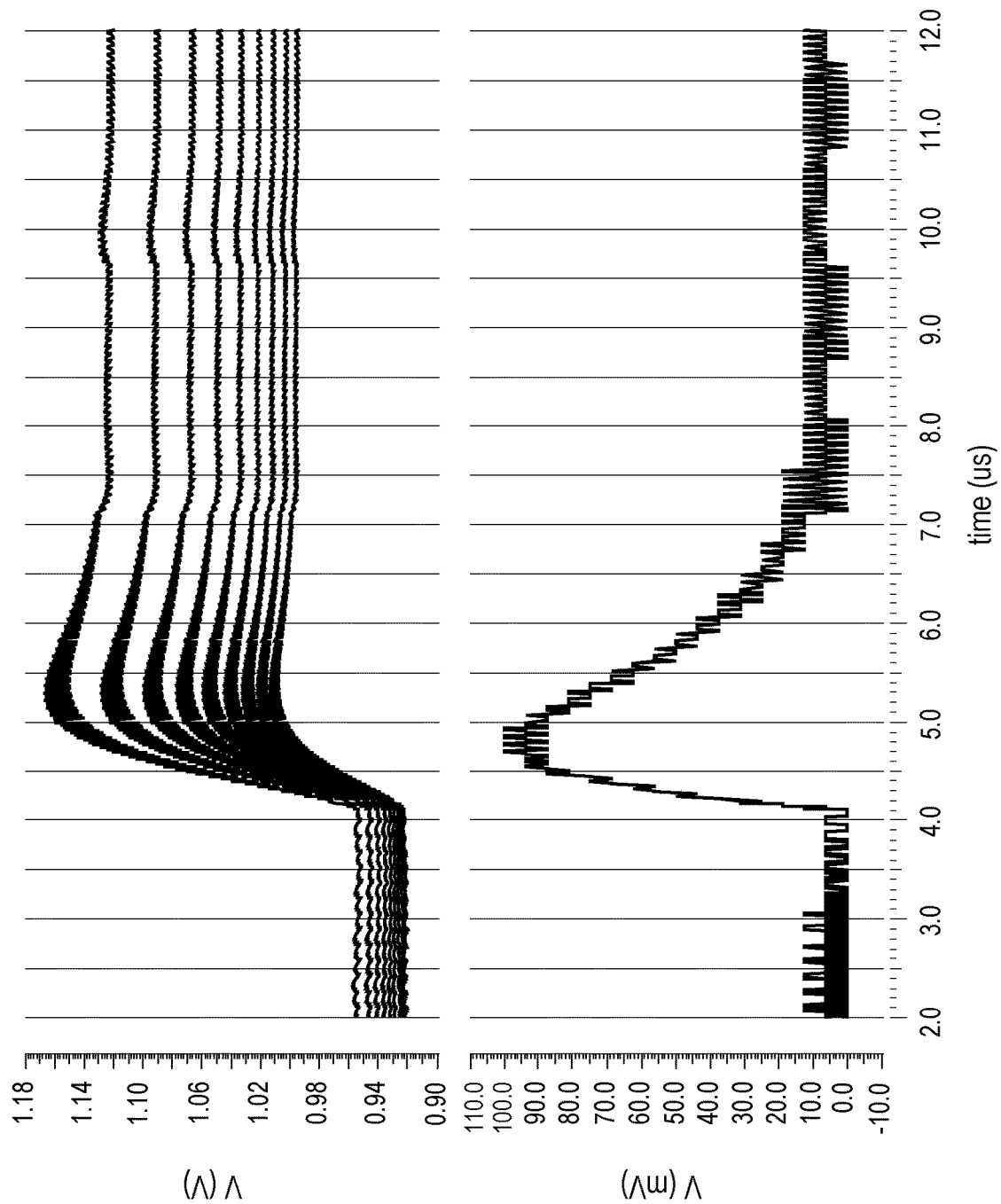
FIG. 14 is a plot of simulation results of VCO control voltage and TDC output over a $K_{VCO}$ variation of +/−40%, with BW characterization.

FIG. 14 plots the simulated PLL step response after BW characterization, for the same $K_{VCO}$ variation range as in FIG. 13. It is evident that after the charge pump current $I_{CP}$ is adjusted to compensate for the $K_{VCO}$ variations, the output of the TDC is almost the same, regardless of $K_{VCO}$ variations. This translates to almost constant PLL bandwidth and phase margin.

FIGS. 15A and 15B compare the simulated step responses with and without BW characterization. It is clear that without correction, the PLL bandwidth increases as $K_{VCO}$ increases (FIG. 15a), whereas after BW characterization, all step responses are almost identical (FIG. 15b). This proves the utility and efficiency of the inventive PLL bandwidth characterization method. Based on the result after BW characterization, the simulated bandwidth deviation is estimated to be actually even lower than the value of 2% obtained with the System Identification Toolbox in MATLAB (FIG. 12).

Figure 16:
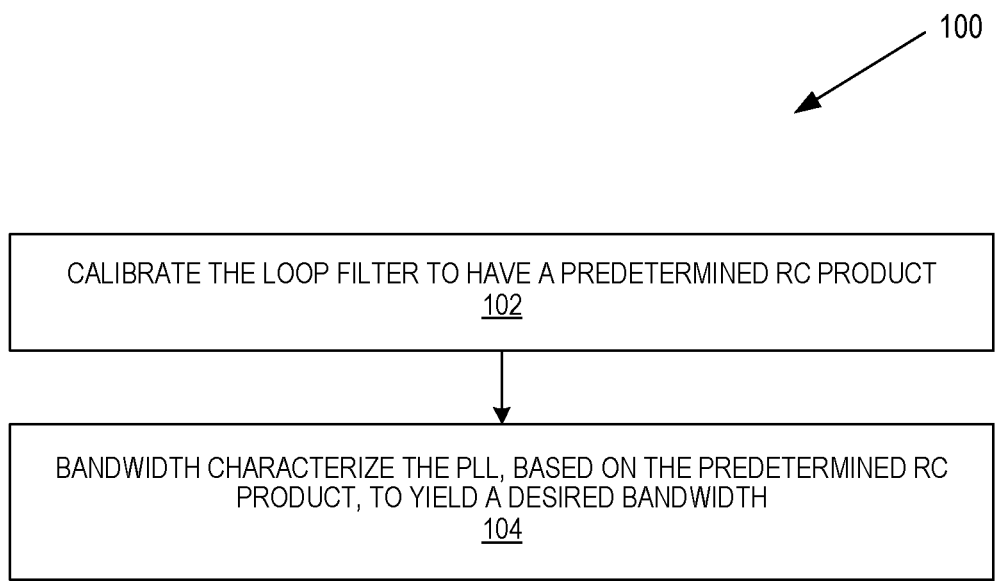
FIG. 16 is a flow diagram of a method of controlling the bandwidth of a digitally augmented analog PLL.

FIG. 16 is a flow diagram depicting the steps in a method 100 of controlling the bandwidth of a digitally augmented analog Phase Locked Loop (PLL). An analog PLL includes a Phase Frequency Detector (PFD), a Charge Pump (CP), a loop filter (LF), a Voltage Controlled Oscillator (VCO), and a frequency divider (DIV). In a digital control circuit, the loop filter is calibrated to have a predetermined RC product (block 102). Also in the digital control circuit, the PLL is bandwidth characterized, based on the predetermined RC product, to yield a desired bandwidth (block 104).

Figure 17:
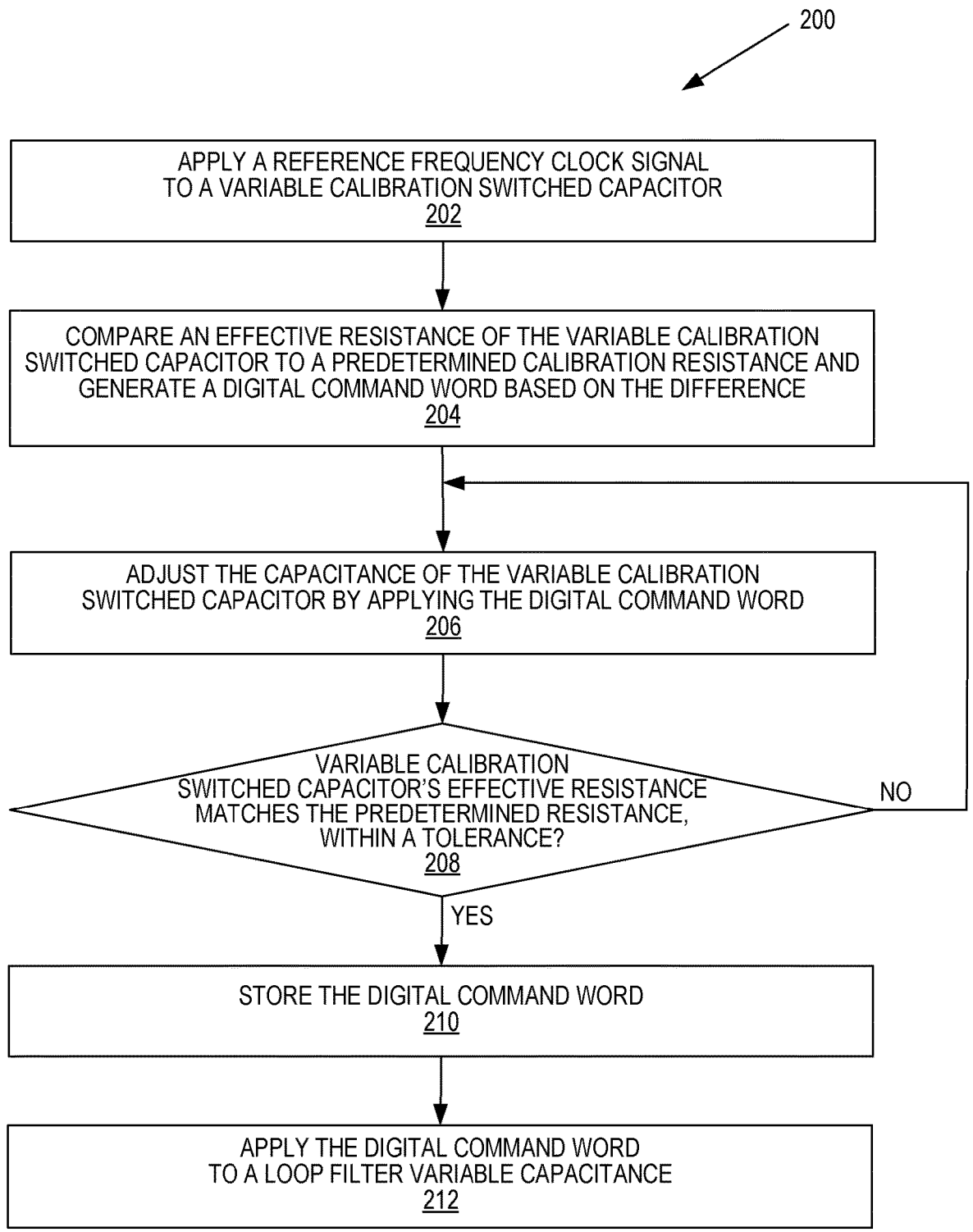
FIG. 17 is a flow diagram of a method of PLL loop filter calibration.

FIG. 17 is a flow diagram of a method 200 of digitally calibrating the loop filter in an analog PLL to have a predetermined RC product, according to one embodiment. The method 200 is one implementation of block 102 of the method 100 described above. A reference frequency clock signal is applied to a variable calibration switched capacitor (block 202). An effective resistance of the variable calibration switched capacitor is compared to a predetermined calibration resistance, and a digital command word based on the difference is generated (block 204). The capacitance of the variable calibration capacitor is adjusted by applying the digital command word (block 206), until the variable calibration capacitor's effective resistance matches the predetermined resistance, within a tolerance (block 208). The digital command word is then stored (block 210). The digital command word is applied to one or more loop filter variable capacitances (block 212) and the digital control circuit disables the digital loop filter calibration circuit for analog PLL operation. The predetermined calibration resistance is chosen such that after calibration, the loop filter RC product has a predetermined value. Those of skill in the art will readily recognize that a substantially similar method could calibrate a variable resistance against a predetermined calibration capacitance chosen to achieve the predetermined RC product.

Figure 18:
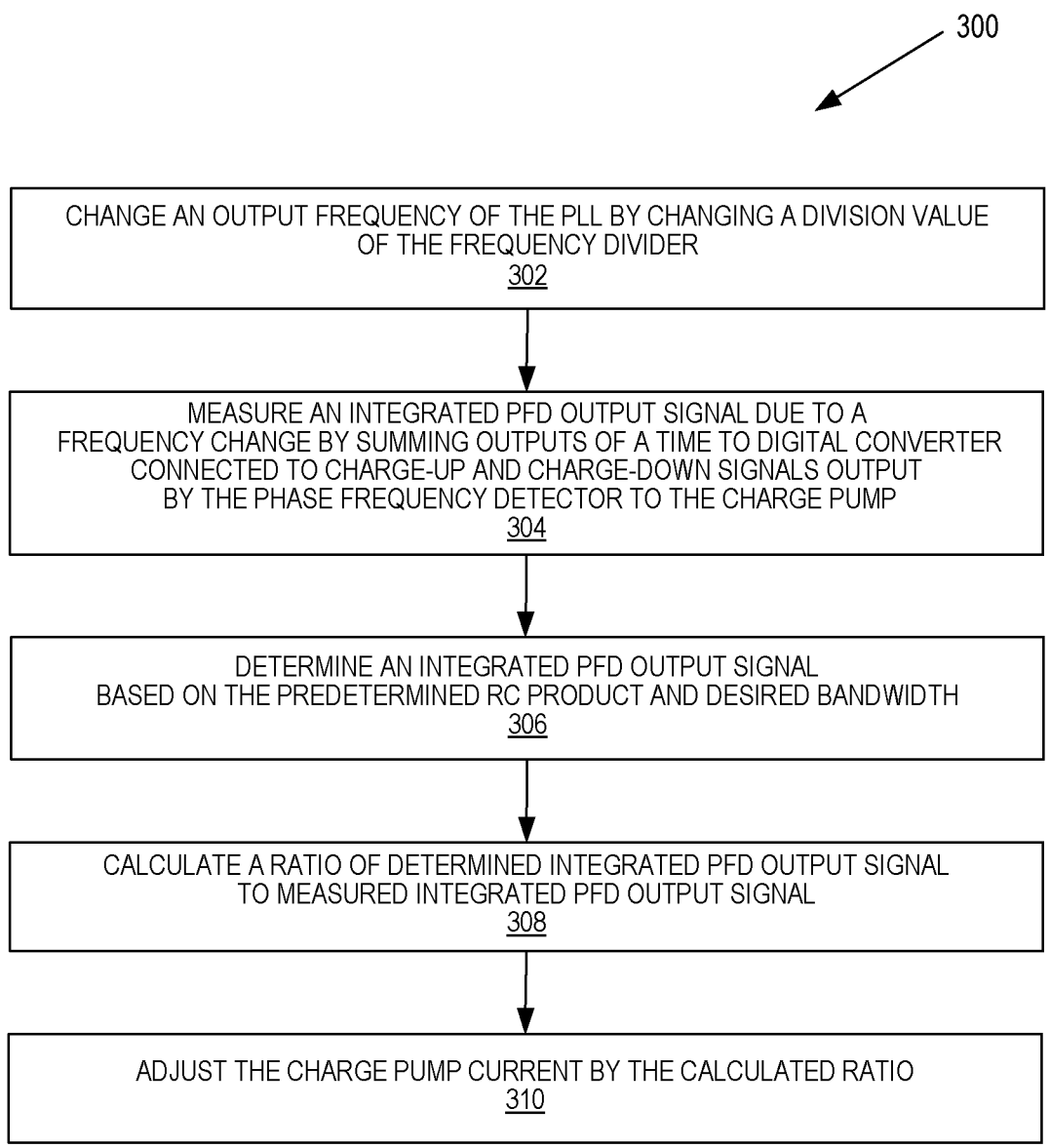
FIG. 18 is a flow diagram of a method of PLL bandwidth characterization.

FIG. 18 is a flow diagram of a method 300 of digitally bandwidth characterizing an analog PLL. The method 300 is an implementation of block 104 of the method 100 described above. An output frequency of the PLL is changed by changing a division value of the frequency divider (block 302). An integrated PFD output signal resulting from the frequency change is measured by summing outputs of a Time to Digital Converter connected to charge-up and charge-down signals output by the phase frequency detector to the charge pump (block 304). A target integrated PFD output signal is determined based on the predetermined RC product and desired bandwidth (block 306). A ratio of determined target integrated PFD output signal to measured integrated PFD output signal is calculated (block 308). The charge pump current is adjusted by the calculated ratio (block 310). The bandwidth of the analog PLL is then constant, regardless of variations in the gain of the VCO. The digital control circuit then disables the TDCs.

An important application (although by no means the only important one) of high-frequency, bandwidth-accurate PLLs is in transceivers in wireless communications systems and devices. In particular, current and planned future generations of wireless communication networks operate at high frequencies (e.g., 1-100 GHz), and employ advanced communication techniques, including spatial diversity and/or spatial multiplexing; beamforming; and frequency hopping.

Spatial diversity refers to transmitting the same signal on different propagations paths (e.g., different transmit/receive antennas), which increases robustness against fading, co-channel interference, and other deleterious effects of RF signal transmission. Spatial multiplexing also uses multiple transmit and receive antennas, and refers to transmitting different portions of data on different propagation paths, using space-time coding, to increase data rates. These techniques are collectively referred to as Multiple Input, Multiple Output, or "MIMO."

Beamforming refers to the use of antennas having increased and controllable directionality, whereby an RF transmission is narrow, and is "aimed" in a specific direction. This may be accomplished by the use of a phased-array antenna comprising a large plurality of antenna elements. The relative phases of transmit signals sent to each antenna element are controlled to create constructive or destructive interference in different directions, and hence controlling the direction in which the beam is transmitted. Similar phase manipulation of signals from antenna elements in a receive antenna can also result in beamforming the sensitivity of a phased-array antenna in receiving signals.

As the term implies, frequency hopping refers to RF transmission by rapidly changing the carrier frequency, in a predetermined or calculable manner, among one or more sets of distinct frequencies within a frequency band. Frequency hopping minimizes the effect of interference at any given frequency, such as from conventional narrowband communications, as transmission and reception occur at that frequency for only a brief duration. Conversely, a frequency hopping transmitter imposes minimal interference on the conventional narrowband system, for the same reason. Frequency hopping minimizes the probability of interference among transmitters in the same network, as they are unlikely to hop on the same pattern at the same time. The technique also improves security, as the signal cannot be intercepted without knowledge of the frequency hopping pattern.

Another important technique in wireless communications is direct modulation of phase- and/or frequency-modulated signals by a PLL. For example, the Bluetooth standard of ad hoc wireless networking benefits from this approach. An accurate and steady PLL transfer function is critical to achieve accurate modulation in such designs.

All of these advanced communications techniques require highly precise, agile, phase-accurate periodic signal generators, such as PLLs. Due to the very high frequencies, large numbers of PLLs that may be required, and strict power budgets (particularly in battery-operated devices), analog PLL designs are preferred. As described herein, augmenting the analog PLLs with digital circuits to perform loop filter calibration and PLL bandwidth characterization ensures an accurate PLL bandwidth, even as component values and VCO sensitivity vary, such as by temperature drift.

Figure 19:
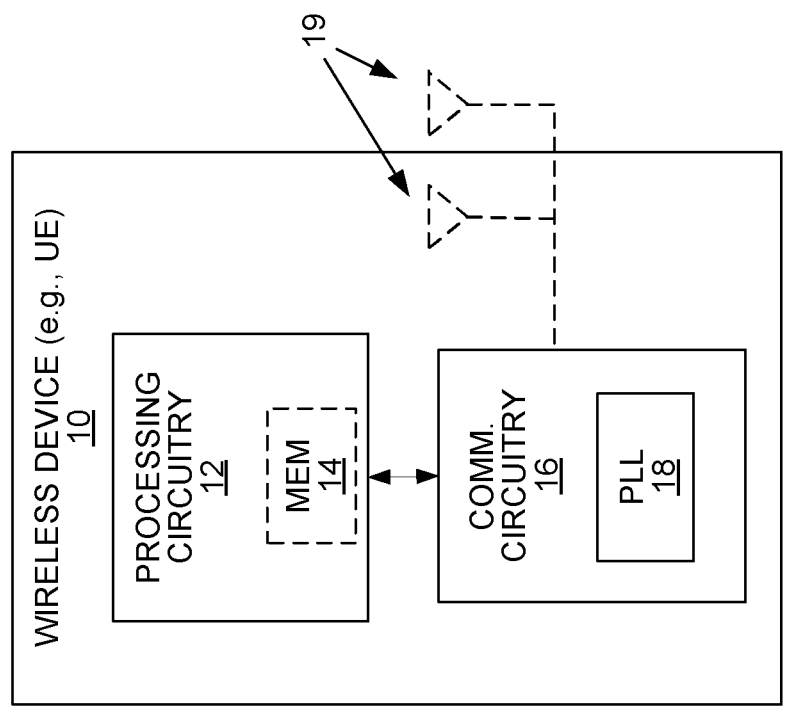
FIG. 19 is a block diagram of a wireless device.

FIG. 19 depicts a wireless device 10 operative in a wireless communication network, such a 3GPP LTE or NR network; a wireless LAN, such as Wi-Fi; an ad hoc wireless network, such as Bluetooth; or the like. A wireless device 10 is any type device capable of communicating with a network node, access point, and/or other wireless device using radio signals. A wireless device 10 may therefore refer to a machine-to-machine (M2M) device, a machine-type communications (MTC) device, a Narrowband Internet of Things (NB IoT) device, etc. The wireless device 10 may also be a User Equipment (UE), such as a cellular telephone or "smartphone." A wireless device 10 may also be referred to as a radio device, a radio communication device, a radio network device, a wireless terminal, or simply a terminal—unless the context indicates otherwise, the use of any of these terms is intended to include device-to-device UEs or devices, machine-type devices, or devices capable of machine-to-machine communication, sensors equipped with a radio network device, wireless-enabled table computers, mobile terminals, smart phones, laptop-embedded equipped (LEE), laptop-mounted equipment (LME), USB dongles, wireless customer-premises equipment (CPE), etc. In the discussion herein, the terms machine-to-machine (M2M) device, machine-type communication (MTC) device, wireless sensor, and sensor may also be used. It should be understood that these devices may be UEs, but may be configured to transmit and/or receive data without direct human interaction.

In some embodiments, the wireless device 10 includes a user interface (display, touchscreen, keyboard or keypad, microphone, speaker, and the like); in other embodiments, such as in many M2M, MTC, or NB IoT scenarios, the wireless device 10 may include only a minimal, or no, user interface. The wireless device 10 also includes processing circuitry 12; memory 14; and communication circuits 16. According to embodiments of the present invention, the communication circuits 16 include a digitally augmented analog PLL 18, as described herein. The communication circuits 16 connect to one or more antennas 19, to effect wireless communication across an air interface to one or more radio network nodes, access points, and/or other wireless devices. As indicated by the dashed lines, the antenna(s) 19 may protrude externally from the wireless device 10, or the antenna(s) 19 may be internal. In various embodiments, the wireless device 10 may include a sophisticated user interface, and may additionally include features such as one or more cameras, an accelerometer, satellite navigation signal receiver circuitry, a vibrating motor, and the like (not depicted in FIG. 19).

Figure 20:
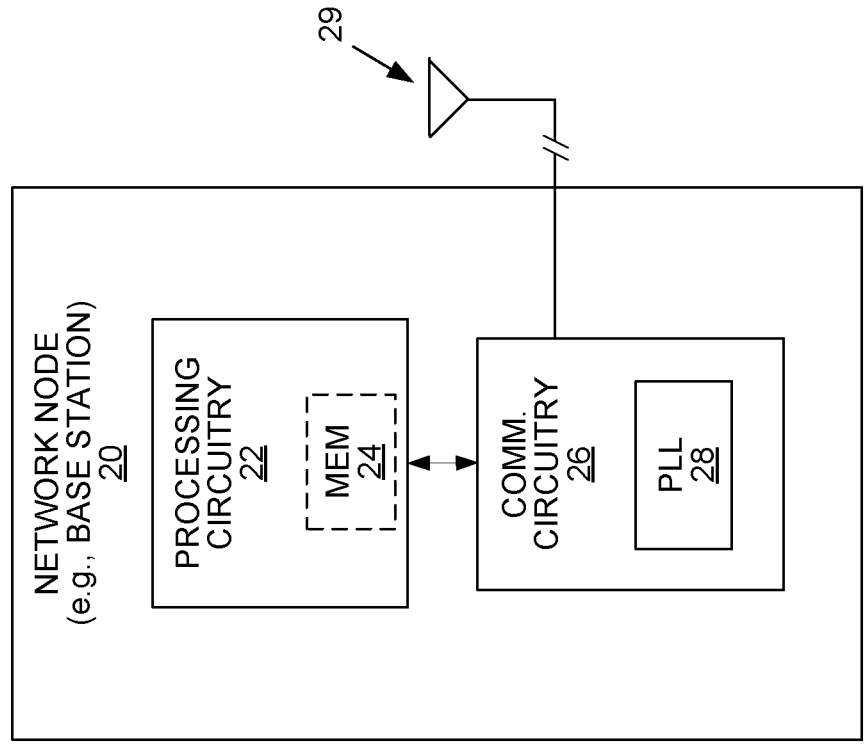
FIG. 20 is a block diagram of a network node.

FIG. 20 illustrates a network node 20 as implemented in accordance with one or more embodiments. The network node 20 may comprise a base station or an access point of a wireless communication network. As shown, the network node 20 includes processing circuitry 22, memory 24, and communication circuitry 26. According to embodiments of the present invention, the communication circuitry 26 includes a digitally augmented analog PLL 28, as described herein. The communication circuitry 26 is configured to transmit and/or receive information to and/or from one or more wireless devices 10, or other network nodes. The communication circuitry 26 is operatively connected to one or more antennas 29. As indicated by the broken connection, the antenna(s) 29 may be located remotely, such as on a tower or building. Although the memory 14 is depicted as being separate from the processing circuitry 12, those of skill in the art understand that the processing circuitry 12 includes internal memory, such as a cache memory or register file. Those of skill in the art additionally understand that virtualization techniques allow some functions nominally executed by the processing circuitry 12 to actually be executed by other hardware, perhaps remotely located (e.g., in the so-called "cloud").

In all embodiments, the processing circuitry 12, 22 may comprise any sequential state machine operative to execute machine instructions stored as machine-readable computer programs in memory 14, 24, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), or any combination of the above.

In all embodiments, the memory 14, 24 may comprise any non-transitory machine-readable media known in the art or that may be developed, including but not limited to magnetic media (e.g., floppy disc, hard disc drive, etc.), optical media (e.g., CD-ROM, DVD-ROM, etc.), solid state media (e.g., SRAM, DRAM, DDRAM, ROM, PROM, EPROM, Flash memory, solid state disc, etc.), or the like.

In all embodiments, the communication circuits 16, 26 may comprise one or more transceivers used to communicate with one or more other transceivers via a Radio Access Network (RAN) according to one or more communication protocols known in the art or that may be developed, such as IEEE 802.xx, CDMA, WCDMA, GSM, LTE, UTRAN, WiMax, NB-IoT, Bluetooth, or the like. The communication circuitry 16, 26 implements transmitter and receiver functionality appropriate to the RAN links (e.g., frequency allocations and the like).

Those skilled in the art will also appreciate that embodiments described herein further include corresponding computer programs. A computer program comprises instructions which, when executed on at least one processor of an apparatus, cause the apparatus to carry out any of the respective processing described above. A computer program in this regard may comprise one or more code modules corresponding to the means or units described above.

Embodiments further include a carrier containing such a computer program. This carrier may comprise one of an electric signal, optical signal, radio signal, or computer readable storage medium.

In this regard, embodiments herein also include a computer program product stored on a non-transitory computer readable (storage or recording) medium and comprising instructions that, when executed by a processor or Digital Control circuit, cause the apparatus to perform as described above.

Embodiments of the present invention present numerous advantages over the prior art. By using a low complexity analog PLL architecture, the benefits of low design effort, high frequency, and low power consumption are retained, while the digital calibration and BW compensation circuits add the benefits of a digital PLL architecture. The loop filter calibration ensures the correct RC product, so that the pole and zero occur at the correct frequencies, regardless of component variation or temperature drift. The BW characterization ensures that the PLL operates at the design bandwidth, regardless of variations in VCO gain sensitivity (which is also temperature dependent). After the loop filter calibration and BW characterization procedures, the PLL can be used for phase/frequency modulation with high accuracy. The digital circuitry is powered down during steady-state (i.e., most of the time), thus causing negligible additional power consumption and having no influence on spectral purity; accordingly, the design of the digital circuits is not critical. The analog PLL can be designed independently of the digital circuits, using well established design methods. Also, the digital enhancements can be added to existing analog PLL designs. The TDCs and Digital Control circuitry can also be used to perform fast frequency hops, as described in PCT Patent Application No. PCT/EP2020/054601.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the description.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

Some of the embodiments contemplated herein are described more fully with reference to the accompanying drawings. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

The invention claimed is:

1. A method of controlling a bandwidth of a digitally augmented analog Phase Locked Loop (PLL) comprising a Phase Frequency Detector (PFD), a Charge Pump (CP), a loop filter (LF), a Voltage Controlled Oscillator (VCO), a frequency divider (DIV), a Time to Digital Converter (TDC) connected to an output of the PFD, and an LF calibration circuit (CAL), the method comprising, in a Digital Control circuit:
controlling the CAL to calibrate the LF to have a predetermined Resistance*Capacitance (RC) product; and
bandwidth characterizing the analog PLL, based on the predetermined RC product, to yield a desired bandwidth, by performing a frequency step, wherein the bandwidth characterizing is additionally based on an integrated PFD output signal;
wherein the TDC is configured to digitize a width of charge-up or charge-down signals output by the PFD, and the integrated PFD output signal is estimated by summing outputs of the TDC.

2. The method of claim 1, wherein calibrating the LF comprises:
applying a reference frequency clock signal to a variable calibration switched capacitor;
comparing an effective resistance of the variable calibration switched capacitor to a predetermined calibration resistance and generating a digital command word based on a difference;
adjusting the capacitance of the variable calibration switched capacitor by applying the digital command word, until the variable calibration switched capacitor's effective resistance matches the predetermined calibration resistance, within a tolerance;
storing the digital command word; and
applying the digital command word to a loop filter variable capacitance;
whereby the predetermined calibration resistance is chosen such that after calibration, the loop filter RC product has a predetermined value.

3. The method of claim 1, wherein calibrating the LF comprises:
applying a reference frequency clock signal to a calibration switched capacitor to yield a predetermined effective resistance;
comparing an effective resistance of the calibration switched capacitor to a variable calibration resistor and generating a digital command word based on the a difference;
adjusting the resistance of the variable calibration resistor by applying the digital command word, until the variable calibration resistor's resistance matches the predetermined effective resistance of the calibration switched capacitor, within a tolerance;
storing the digital command word; and
applying the digital command word to a loop filter variable resistor;
whereby the predetermined effective resistance of the calibration switched capacitor is chosen such that after calibration, the loop filter RC product has a predetermined value.

4. The method of claim 1, wherein bandwidth characterizing the digitally augmented analog PLL comprises:
changing an output frequency of the digitally augmented analog PLL by changing a division value of the DIV;
measuring the integrated PFD output signal due to the frequency change by summing outputs of the Time to Digital Converter (TDC) connected to charge-up and charge-down signals output by the PFD to the CP;
determining a target integrated PFD output signal based on the predetermined RC product and desired bandwidth;
calculating a ratio of determined target integrated PFD output signal to measured integrated PFD output signal; and
adjusting the CP current by the calculated ratio.

5. The method of claim 4 wherein determining the target integrated PFD output signal based on the predetermined RC product and desired bandwidth comprises:
determining the target integrated PFD output signal as proportional to the RC product divided by the desired bandwidth.

6. The method of claim 5 wherein determining the target integrated PFD output signal as proportional to the RC product divided by the desired bandwidth comprises:
determining the target integrated PFD output signal as proportional to a fractional division step size normalization factor times the RC product divided by the desired bandwidth;
wherein the fractional division step size normalization factor is step/$step_{max}$, where step is a number of unit frequency steps of a frequency control word used to set a fractional division number in the DIV and $step_{max}$ is a frequency step corresponding to an integer step size of one.

7. The method of claim 6 wherein a unit frequency step is given by;

$$f_u = N^* f_{ref}/2^{Nfw}$$

where Nfw is a number of bits in the frequency control word used to set the fractional division number in the DIV and $f_{ref}$ is a reference frequency of the digitally augmented analog PLL.

8. A digitally augmented analog Phase Locked Loop (PLL), comprising:
  an analog PLL comprising;
    a Phase Frequency Detector (PFD) configured to compare a PLL feedback signal to a reference frequency input signal and output charge-up or charge-down pulses having a length proportional to a phase error between the PLL feedback signal and reference input signal;
    a Charge Pump (CP) configured to generate a positive or negative CP current in response to the length of the charge-up or charge-down pulses, respectively;
    a loop filter (LF) configured to accumulate or dissipate charge on a capacitor in response to the positive or negative CP current and to output a responsive control voltage;
    a Voltage Controlled Oscillator (VCO) configured to generate a periodic output signal having a frequency determined by the control voltage; and
    a frequency divider (DIV) configured to divide the periodic output signal by an integer or fractional amount to generate the PLL feedback signal; and
  a Time to Digital Converter (TDC) receiving the charge-up and charge-down pulses and configured to output a digital value indicating a duration of the pulses;
  a digital LF calibration circuit (CAL) configured to control a value of one or both of a resistor and a capacitor in the LF so as to achieve a predetermined Resistance*Capacitance (RC) product; and
  a Digital Control circuit configured to;
    calibrate the LF to have the predetermined RC product; and
    bandwidth characterize the analog PLL, based on the predetermined RC product, to yield a desired bandwidth.

9. The digitally augmented analog PLL of claim 8 wherein the Digital Control circuit is further configured to bandwidth characterize the analog PLL by performing a frequency step, and wherein the bandwidth characterization is additionally based on an integrated PFD output signal.

10. The digitally augmented analog PLL of claim 9 further comprising;
  the Time to Digital Converter (TDC) connected to the output of the PFD and configured to digitize a width of charge-up or charge-down signals output by the PFD, and wherein the integrated PFD output signal is estimated by summing outputs of the TDC.

11. The digitally augmented analog PLL of claim 8 wherein the Digital Control circuit is configured to calibrate the LF by:
  applying a reference frequency clock signal to a variable calibration switched capacitor;
  comparing an effective resistance of the variable calibration switched capacitor to a predetermined calibration resistance and generating a digital command word based on a difference;
  adjusting the capacitance of the variable calibration switched capacitor by applying the digital command word, until the variable calibration switched capacitor's effective resistance matches the predetermined calibration resistance, within a tolerance;
  storing the digital command word; and applying the digital command word to a loop filter variable capacitance; whereby the predetermined calibration resistance is chosen such that after calibration, the loop filter RC product has a predetermined value.

12. The digitally augmented analog PLL of claim 8 wherein the Digital Control circuit is configured to calibrate the LF by:
  applying a reference frequency clock signal to a calibration switched capacitor to yield a predetermined effective resistance;
  comparing an effective resistance of the calibration switched capacitor to a variable calibration resistor and generating a digital command word based on a difference;
  adjusting the resistance of the variable calibration resistor by applying the digital command word, until the variable calibration resistor's resistance matches the predetermined effective resistance of the calibration switched capacitor, within a tolerance;
  storing the digital command word; and
  applying the digital command word to a loop filter variable resistor;
  whereby the predetermined effective resistance of the calibration switched capacitor is chosen such that after calibration, the loop filter RC product has a predetermined value.

13. The digitally augmented analog PLL of claim 8 wherein the Digital Control circuit is configured to bandwidth characterize the PLL by:
  changing an output frequency of the PLL by changing a division value of the DIV;
  measuring an integrated PFD output signal resulting from the frequency change by summing outputs of the TDC;
  determining a target integrated PFD output signal based on the predetermined RC product and desired bandwidth;
  calculating a ratio of determined target integrated PFD output signal to measured integrated PFD output signal; and
  adjusting the CP current by the calculated ratio.

14. The digitally augmented analog PLL of claim 13 wherein the Digital Control circuit is configured to determine tie target integrated PFD output signal based on the predetermined RC product and desired bandwidth by: determining the integrated PFD output signal as proportional to the RC product divided by the desired bandwidth.

15. The digitally augmented analog PLL of claim 14 wherein the Digital Control circuit is configured to determine the target integrated PFD output signal as proportional to the RC product divided by the desired bandwidth by:
  determining the target integrated PFD output signal as proportional to a fractional division step size normalization factor times the RC product divided by the desired bandwidth;
  wherein the fractional division step size normalization factor is step/stepmax, where step is a number of unit frequency steps of a frequency control word used to set a fractional division number in the DIV and stepmax is a frequency step corresponding to an integer step size of one.

16. The digitally augmented analog PLL of claim 15 wherein a unit frequency step is given by;

$$f_u = N^* f_{ref}/2^{Nfw}$$

where Nfw is a number of bits in the frequency control word used to set the fractional division number in the DIV and $f_{ref}$ is a reference frequency of the digitally augmented analog PLL.

17. A wireless device operative in a wireless communication network, comprising:

processing circuitry; and communication circuitry operatively connected to the processing circuitry, the communication circuitry comprising one or more digitally augmented analog Phase Locked Loops (PLL), each comprising;

an analog PLL comprising;
- a Phase Frequency Detector (PFD) configured to compare a PLL feedback signal to a reference frequency input signal and output charge-up or charge-down pulses having a length proportional to a phase error between the PLL feedback signal and reference frequency input signal;
- a Charge Pump (CP) configured to generate a positive or negative CP current in response to the length of the charge-up or charge-down pulses, respectively;
- a loop filter (LF) configured to accumulate or dissipate charge on a capacitor in response to the positive or negative CP current and to output a responsive control voltage;
- a Voltage Controlled Oscillator (VCO) configured to generate a periodic output signal having a frequency determined by the control voltage; and
- a frequency divider (DIV) configured to divide the periodic output signal by an integer or fractional amount to generate the PLL feedback signal; and a Time to Digital Converter (TDC) receiving the charge-up and charge-down pulses and configured to output a digital value indicating a duration of the pulses;

a digital LF calibration circuit (CAL) configured to control a value of one or both of a resistor and the capacitor in the LF so as to achieve a predetermined RC product; and a Digital Control circuit configured to;
- calibrate the LF to have the predetermined RC product; and
- bandwidth characterize the analog PLL, based on the predetermined RC product, to yield a desired bandwidth.

18. A network node operative in a wireless communication network, comprising:

processing circuitry; and communication circuitry operatively connected to the processing circuitry, the communication circuitry comprising one or more digitally augmented analog Phase Locked Loops (PLL), comprising;

an analog PLL comprising
- a Phase Frequency Detector (PFD) configured to compare a PLL feedback signal to a reference frequency input signal and output charge-up or charge-down pulses having a length proportional to a phase error between the PLL feedback signal and reference frequency input signal;
- a Charge Pump (CP) configured to generate a positive or negative CP current in response to the length of the charge-up or charge-down pulses, respectively;
- a loop filter (LF) configured to accumulate or dissipate charge on a capacitor in response to the positive or negative CP current and to output a responsive control voltage;
- a Voltage Controlled Oscillator (VCO) configured to generate a periodic output signal having a frequency determined by the control voltage; and
- a frequency divider (DIV) configured to divide the periodic output signal by an integer or fractional amount to generate the PLL feedback signal; and a Time to Digital Converter (TDC) receiving the charge-up and charge-down pulses and configured to output a digital value indicating a duration of the pulses;

a digital LF calibration circuit (CAL) configured to control a value of one or both of a resistor and a capacitor in the LF so as to achieve a predetermined RC product; and a Digital Control circuit configured to;
- calibrate the LF to have the predetermined RC product; and
- bandwidth characterizes the analog PLL, based on the predetermined RC product, to yield a desired bandwidth.

* * * * *